(12) United States Patent
Kimizuka et al.

(10) Patent No.: US 6,587,495 B2
(45) Date of Patent: Jul. 1, 2003

(54) SEMICONDUCTOR LASER DEVICE, AND IMAGE FORMING APPARATUS

(75) Inventors: Junichi Kimizuka, Yokohama (JP);
Tomohiro Nakamori, Sunto-gun (JP);
Akira Nakaya, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/843,705

(22) Filed: Apr. 30, 2001

(65) Prior Publication Data

US 2001/0015992 A1 Aug. 23, 2001

Related U.S. Application Data

(62) Division of application No. 09/138,548, filed on Aug. 24, 1998.

(30) Foreign Application Priority Data

Aug. 28, 1997 (JP) ............................................. 09-233093

(51) Int. Cl.[7] .................................................. H01S 5/00
(52) U.S. Cl. ...................................................... 372/50
(58) Field of Search ............................. 372/50, 36, 45, 372/46, 96, 92, 31

(56) References Cited

U.S. PATENT DOCUMENTS

| 4,794,609 | A | * | 12/1988 | Hara et al. | ..................... 372/50 |
| 4,843,610 | A | * | 6/1989 | Okada et al. | .................. 372/31 |
| 5,490,160 | A | * | 2/1996 | Kovacs et al. | ................. 372/50 |
| 5,784,396 | A | * | 7/1998 | Guerin | ........................ 372/36 |

FOREIGN PATENT DOCUMENTS

| JP | 56-130986 | 10/1981 |
| JP | 57-23289 | 2/1982 |
| JP | 63-234584 | 9/1988 |
| JP | 9-164722 | 6/1997 |

* cited by examiner

*Primary Examiner*—Quyen Leung
(74) *Attorney, Agent, or Firm*—Fitzpatrick, Cella, Harper & Scinto (57) ABSTRACT

A semiconductor device includes a semiconductor laser chip having a first light-emitting surface which is formed on one end face of the semiconductor laser chip and which outputs a plurality of front beams, and a second light-emitting surface which is formed on an end face opposite to the first light-emitting surface and which outputs a plurality of back beams corresponding to the plurality of front beams. A photodetector is so formed on the semiconductor laser device as to face the second light-emitting surface of the semiconductor laser chip. The photodetector has a plurality of photodetecting portions for independently detecting the plurality of back beams output from the second light-emitting surface. The photodetector is in tight contact with the second light-emitting surface of the semiconductor laser chip.

8 Claims, 11 Drawing Sheets

SEMICONDUCTOR LASER DEVICE, AND IMAGE FORMING APPARATUS

This is a divisional application of application Ser. No. 09/138,548, filed Aug. 24, 1998.

BACKGROUND OF THE INVENTION

1. Field of the Invention

The present invention relates to a semiconductor laser device which uses a semiconductor laser having a plurality of light-emitting portions, and independently detects a plurality of beams, a light amount control device for controlling the light amount of the semiconductor laser, and an image forming apparatus such as a laser printer, or the like.

2. Related Background Art

As an apparatus for controlling the light amount using a semiconductor laser having a plurality of light-emitting portions, for example, a laser printer disclosed in Japanese Laid-Open Patent Application No. 57-23289 is known. In this laser printer, a plurality of beams emitted by the semiconductor laser are scanned and irradiated onto the surface of a photosensitive drum to form an image by electrophotography.

In this case, as described in, e.g., Japanese Laid-Open Patent Application No. 9-164722, the light amount control is attained by detecting light outputs from a plurality of light-emitting portions of the semiconductor laser using a single photodetector.

However, especially in case of a semiconductor laser which comprises a plurality of light-emitting portions on a monolithic semiconductor laser chip, when a current is supplied to one light-emitting portion, heat produced by that portion is conducted to other light-emitting portions, and lowers the emission efficiency of these light-emitting portions, resulting in an emission amount drop (such phenomenon is called thermal interference).

When the emission amount drops, density nonuniformity occurs in an image upon writing the image by the laser beam printer, thus deteriorating the image quality.

SUMMARY OF THE INVENTION

It is, therefore, an object of the present invention to provide a semiconductor laser device which can remove variations of front beam output light amounts due to thermal interference among a plurality of light-emitting portions and can obtain a high-quality image by independently detecting a plurality of beams output from the light-emitting portions, and controlling the light amounts in real time in units of light-emitting portions, a light amount control device for controlling the light amount of a semiconductor laser, and an image forming apparatus such as a laser printer, or the like.

A semiconductor laser device of the present invention comprises a semiconductor laser chip formed with a first light-emitting surface which is formed on one end face of the chip and outputs a plurality of front beams, and a second light-emitting surface which is formed on an end face opposite to the first light-emitting surface of the semiconductor laser chip and outputs a plurality of back beams corresponding to the plurality of front beams, and back beam detection means formed to face the second light-emitting surface of a light-emitting portion of the semiconductor laser chip and having a plurality of photodetection portions for independently detecting the plurality of back beams output from the second light-emitting surface, the back beam detection means being in tight contact with the second light-emitting surface of the semiconductor laser chip.

The back beam detection means may be adhered to the semiconductor laser chip by an adhesive.

The plurality of photodetection portions of the back beam detection means may be formed on a single substrate to be isolated from each other.

The back beam detection means may be attached to the second light-emitting surface of the semiconductor laser chip with a local region thereof extending therefrom, and a lead electrode may be formed on the local region that extends upon attachment.

A semiconductor laser device of the present invention comprises a semiconductor laser chip formed with a first light-emitting surface which is formed on one end face of the chip and outputs a plurality of front beams, and a second light-emitting surface which is formed on an end face opposite to the first light-emitting surface of the semiconductor laser chip and outputs a plurality of back beams corresponding to the plurality of front beams, and back beam detection means obliquely formed on the second light-emitting surface of a light-emitting portion of the semiconductor laser chip and having a plurality of photodetection portions for independently detecting the plurality of back beams output from the second light-emitting surface.

The back beam detection means may be set on an inclined surface of a light transmission member.

Light-shielding means may be inserted between light beams that enter the photodetection portions of the back beam detection means.

A mirror may be inserted between light beams that enter the photodetection portions of the back beam detection means.

An optical filter may be interposed between the second light-emitting surface of the semiconductor laser chip and the back beam detection means.

A semiconductor laser device of the present invention comprises a semiconductor laser chip formed with a first light-emitting surface which is formed on one end face of the chip and outputs a plurality of front beams, and a second light-emitting surface which is formed on an end face opposite to the first light-emitting surface of the semiconductor laser chip and outputs a plurality of back beams corresponding to the plurality of front beams, a transparent insulating layer which is formed on the second light-emitting surface and transmits light therethrough, and back beam detection means formed on the transparent insulating layer and having a plurality of photodetection portions for independently detecting the plurality of back beams output from the second light-emitting surface.

The plurality of photodetection portions of the back beam detection means may include an n-type semiconductor layer formed on the transparent insulating layer, and a p-type semiconductor formed on the n-type semiconductor layer.

A lead electrode may be formed on a surface of the n- and p-type semiconductor layers.

The back beam detection means may be formed by epitaxial growth or deposition.

Also, a light amount control device of the present invention comprises a semiconductor laser device having the above-mentioned back beam detection means, and light amount feedback control means for independently controlling the amounts of front beams output from the first light-emitting surfaces on the basis of the amounts of light detected by photodetection portions of the back beam detection means in the semiconductor laser device.

Furthermore, according to the present invention, an electrophotographic image forming apparatus which forms an image by irradiating laser beams emitted by the aforementioned semiconductor laser device onto the surface of a photosensitive body, comprises the above-mentioned light amount control device, and can form the image using laser beams, the amounts of which are controlled by the light amount control device.

BRIEF DESCRIPTION OF THE DRAWINGS

FIGS. 5A and 5B show the arrangement of an integrated semiconductor laser device according to the second embodiment of the present invention, in which

DETAILED DESCRIPTION OF THE PREFERRED EMBODIMENTS

The first embodiment of the present invention will be described below with reference to FIGS. 1 to 4. This embodiment will exemplify a laser printer as an example using a semiconductor laser having a plurality of light-emitting portions.

Figure 4:
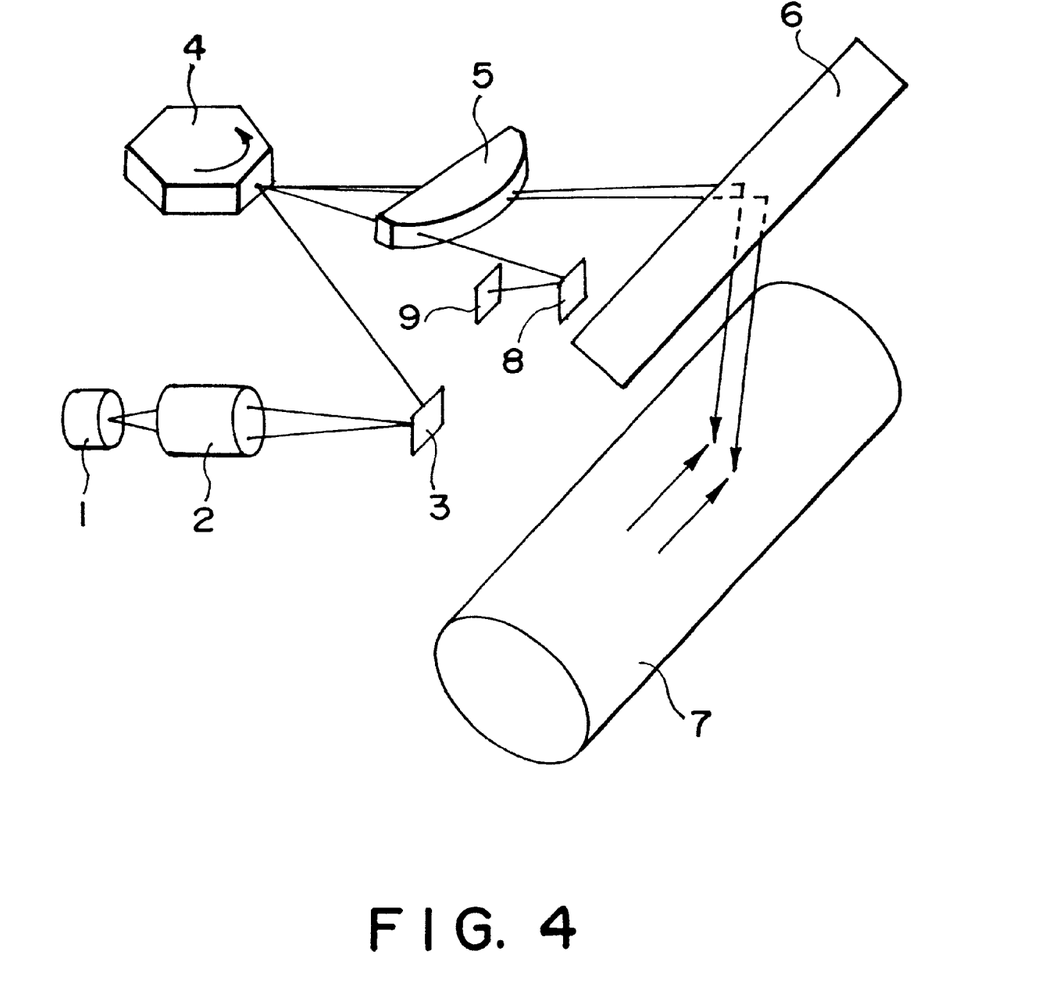
FIG. 4 is a perspective view showing the schematic arrangement of the overall laser printer.

The schematic arrangement of the laser printer will be described first with reference to FIG. 4. A semiconductor laser 1 has a plurality of light-emitting portions. A collimator lens 2 converts a plurality of beams emitted by the semiconductor laser 1 into collimated beams. The collimated beams are reflected by a reflection mirror 3, and are deflected by a polygonal mirror 4. The scanning mode of these deflected light beams is converted by an f-θ lens 5 from equi-angular velocity scanning to equi-velocity scanning, and the converted beams are reflected by a reflection mirror 6, thus being irradiated onto a photosensitive drum 7. The beams scanned by the polygonal mirror 4 are reflected by a reflection mirror 8, and are detected by a beam detector 9. The beam detector 9 detects the scanning start point timing of the beams on the photosensitive drum 7. In synchronism with the detected output signal from the beam detector 9, the semiconductor laser 1 is modulated in correspondence with an image signal, thus forming a latent image on the photosensitive drum 7 as a recording medium.

Figure 1:
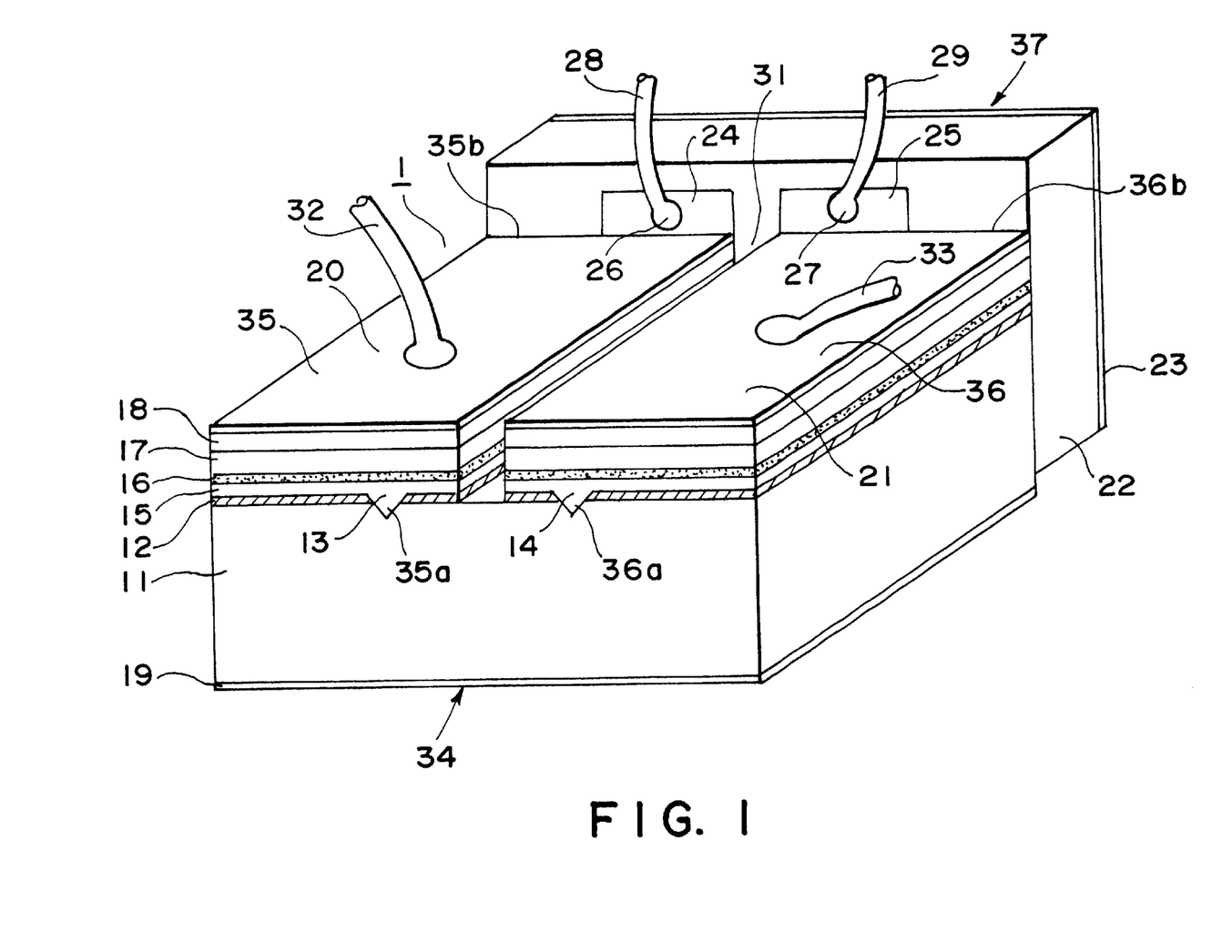
FIG. 1 is a perspective view showing the arrangement of a semiconductor laser device according to the first embodiment of the present invention.

The structure of the semiconductor laser 1 used in this embodiment will be explained below with reference to FIG. 1. This semiconductor laser 1 is formed by a multi-beam laser chip 34 and photodetector 37. The multi-beam laser chip 34 is basically comprised of an internal stripe structure semiconductor element obtained by depositing an n-type current blocking layer on a p-type substrate and forming V-trenches by etching. This element is described in, e.g., Appl. Phys. Lett. vol. 40, Mar. 1, 1982, p. 312. The chip 34 has a p-type GaAs substrate 11 and an n-GaAs current blocking layer 12. Stripe trenches 13 and 14 are formed in the substrate 11 and layer 12 by known photolithography. The current blocking layer 12 is removed from the interiors of the stripe trenches 13 and 14, and these V-portions serve as current paths. The chip 34 also has a p-$Ga_{1-y}Al_yAs$ cladding layer 15, $Ga_{1-x}Al_xAs$ active layer 16 (0<x<y<1), and n-$Ga_{1-y}Al_yAs$ cladding layer 17. An n—GaAs gap layer 18 forms a double heterojunction laser operation crystal multilayer. The chip 34 further has an Au—Zn p-electrode 19, and Au—Ge—Ni n-electrodes 20 and 21. An isolation trench 31 is formed by etching to extend from the n-electrodes 20 and 21 to the GaAs substrate 11 in a direction parallel to the stripe trench 13.

With this isolation trench 31, a plurality of (two in FIG. 1) light-emitting portions 35 and 36 are formed on the multi-beam laser chip 34. These light-emitting portions 35 and 36 are respectively formed with light-emitting surfaces 35a and 36a for outputting front beams, and light-emitting surfaces 35b and 36b for outputting back beams at their opposing end faces. The photodetector 37 is set to have light-receiving portions 24 and 25 which oppose the light-emitting surfaces 35b and 36b that output the back beams of the multi-beam laser chip 34. In this way, since the independent light-emitting portions 35 and 36 are fabricated on the multi-beam laser chip 34 by forming the isolation trench 31, thermal interference between the light-emitting portions 35 and 36 can be reduced.

Wires 32 and 33 are bonded to the n-electrodes 20 and 21 of the laser, and consist of Au, Al, or the like. The thickness of these wires 32 and 33 used is larger than wires 28 and 29 of the photodetector 37. The photodetector 37 and multi-beam laser chip form a hermetically sealed semiconductor laser 1.

Figure 2:
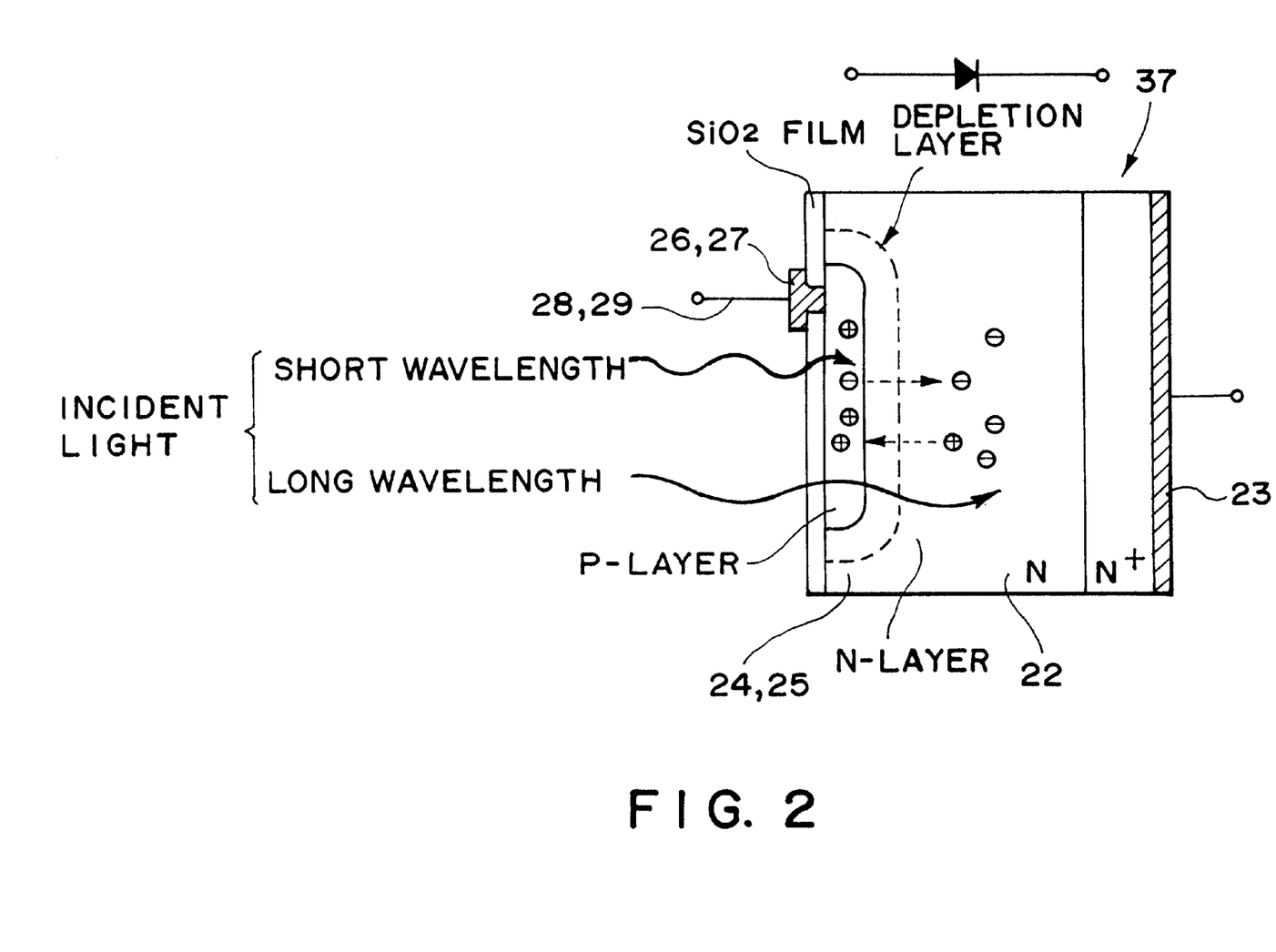
FIG. 2 is a sectional view showing the structure of a photodetector.

The photodetector 37 that receives beams generated by the multi-beam laser chip 34 will be described below with reference to FIG. 2. An n-type silicon substrate 22 serves as the cathode of the photodetector 37. A cathode electrode 23 consists of Au or the like. The two independent light-receiving portions 24 and 25 have p-type layers as doped light-receiving surfaces and have an island shape. These light-receiving portions 24 and 25 serve as the anode of the photodetector 37.

The light-receiving portions 24 and 25 oppose those sides of the light-emitting portions 35 and 36 of the multi-beam laser chip 34, which generate back beams. In this case, the light-receiving surfaces of the light-receiving portions 24 and 25 are preferably as narrow as possible within the range they can cover the divergence of back beams. This is because the light-receiving size determines the stray capacitance of the photodetector 37, and quicker response of the photodetector 37 is assured as the stray capacitance is smaller. When the spacing between the light-receiving surfaces of the light-receiving portions 24 and 25 is small, photocurrents that flow through these light-receiving portions readily leak to the neighboring light-receiving portions. For this reason, the light-receiving surface size is reduced as much as possible to assure an enough distance between the light-receiving surfaces.

An $SiO_2$ protection film is formed on the light-receiving portions 24 and 25 of the photodetector 37. The $SiO_2$ film is formed except for lead electrodes 26 and 27. The lead electrodes 26 and 27 use metal electrodes such as Au, and the wires 28 and 29 such as Au, Al, or the like are bonded to these regions.

In this way, the photodetector 37 with a plurality of light-receiving portions 24 and 25 is adhered so that these light-receiving portions 24 and 25 oppose the light-emitting surfaces 35b and 36b of the light-emitting portions 35 and 36 on the side which generates the back beams of the multi-beam laser chip 34. Note that the $SiO_2$ protection film also serves as an insulating layer for preventing the p- and n-type layers of the photodetector 37 from shot-circuiting to the respective layers of the multi-beam laser chip 34.

The plurality of light-receiving portions 24 and 25 are formed on a single substrate (22) to be isolated from each other.

In this embodiment, since the light-receiving portions of the photodetector 37 are mounted in tight contact with the light-emitting surfaces 35b and 36b of the multi-beam laser chip 34, the beams do not diverge, and the area of each light-receiving surface can be reduced. Hence, a large distance can be assured between the light-receiving portions 24 and 25. For this reason, a quick-response photodetector 37 can be obtained, and interference due to current leakage between the light-receiving portions 24 and 25 can be prevented.

Also, the photodetector 37 serves as a reflection mirror for the light-emitting surfaces 35b and 36b of the multi-beam laser chip 34, and reflects all light energy components, which are originally emitted in the back direction, toward the front direction, thus increasing the laser outputs.

Since the photodetector 7 is adhered to the end face of the multi-beam laser chip 34 on the side of the light-emitting surfaces 35b and 36b using an adhesive so that the anode electrode lead portions 26 and 27 of the photodetector 37 extend from the edge portion of the multi-beam laser chip 34, the wires 28 and 29 can be prevented from interfering with the multi-beam laser chip 34.

Figure 3A:
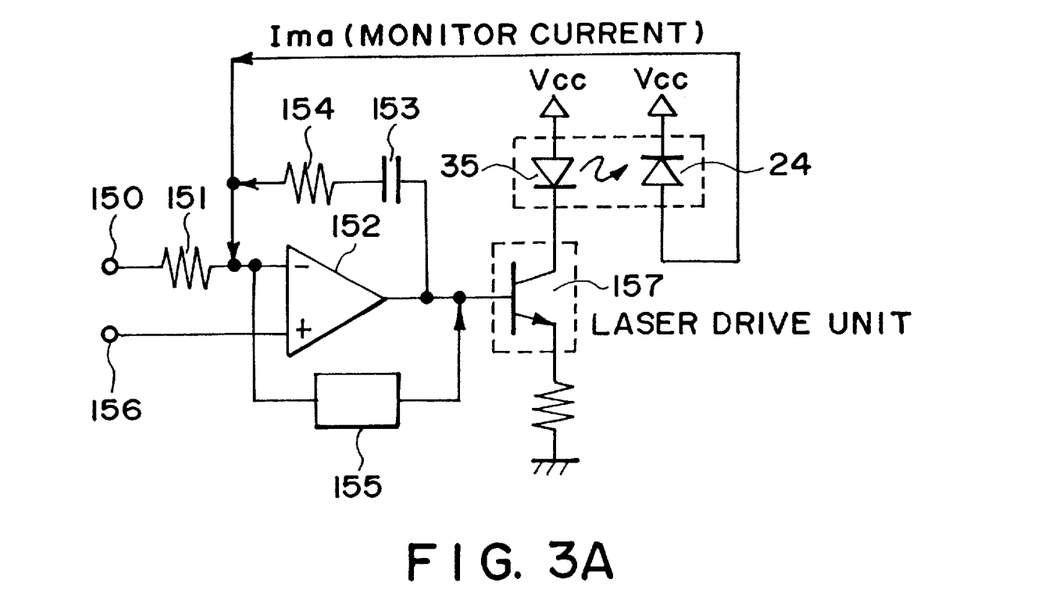
FIGS. 3A and 3B are circuit diagrams showing the arrangement of a light amount control device.
Figure 3B:
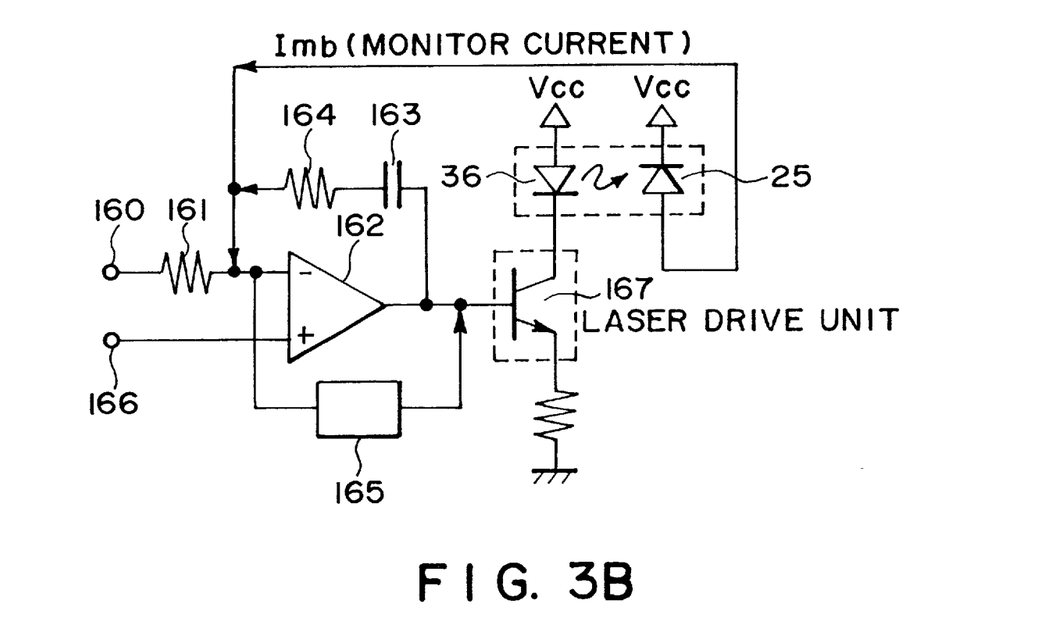

A light control device for controlling the light amount of the semiconductor laser device 1 will be described below with the aid of FIGS. 3A and 3B. In FIG. 3A, the light-emitting portion 35 of the multi-beam laser chip 34 emits a back beam. In FIG. 3B, the light-emitting portion 36 of the multi-beam laser chip 34 emits a back beam. The light-receiving portion 24 of the photodetector 37 receives the back beam. Also, the light-receiving portion 25 of the photodetector 37 receives the back beam. The light-emitting portions 35 and 36 respectively oppose the light-receiving portions 24 and 25, which can independently and simultaneously receive light beams coming from the light-emitting portions 35 and 36 without any interference.

Input terminals 150 and 160 receive image signals for forming an image on the photosensitive drum 7 as a recording medium, and rectangular waves having predetermined amplitudes are applied as the image signals. Resistors 151 and 161 are respectively connected to operational amplifiers 152 and 162. Capacitors 153 and 163 and resistors 154 and 164 respectively determine the frequency characteristics of the operational amplifiers 152 and 162.

Correction amplifiers 155 and 165 respectively correct the phase characteristics of the operational amplifiers 152 and 162 to prevent oscillation. Light amount reference voltage input terminals 156 and 166 receive prescribed voltages to irradiate an appropriate amount of light onto the photosensitive drum 7. Laser current drive transistors 157 and 167 respectively constitute laser drive units.

The operation of these circuits will be explained below. When High-level image signals are input to the input terminals 150 and 160, no laser currents flow. When image signals go Low, currents begin to flow through the transistors 157 and 167, and the light-emitting portions 35 and 36 begin to emit light. When the light-receiving portions 24 and 25 receive the light, monitor currents Ima and Imb flow, and the operational amplifiers 152 and 162 control their outputs so that input voltages at their + and − terminals equal the voltages applied to the corresponding light amount reference voltage input terminals 156 and 166. With these output voltage, the currents to be supplied to the transistors 157 and 167, i.e., laser currents, are determined. This is a real-time APC (Auto Power Controller) operation. With this operation, the laser is controlled to emit a constant amount of light immediately after it begins to emit light.

In this fashion, a plurality of back beams output from the second light-emitting surfaces 35b and 36b of the plurality of light-emitting portions 35 and 36 formed on the semiconductor laser chip 34 are respectively independently detected by the photodetection portions of the back beam detection means, and light amount control is done in real time in units of light-emitting portions, thus reducing variations in amount of front beams output from the first light-emitting surfaces 35a and 36a.

Figure 5A:
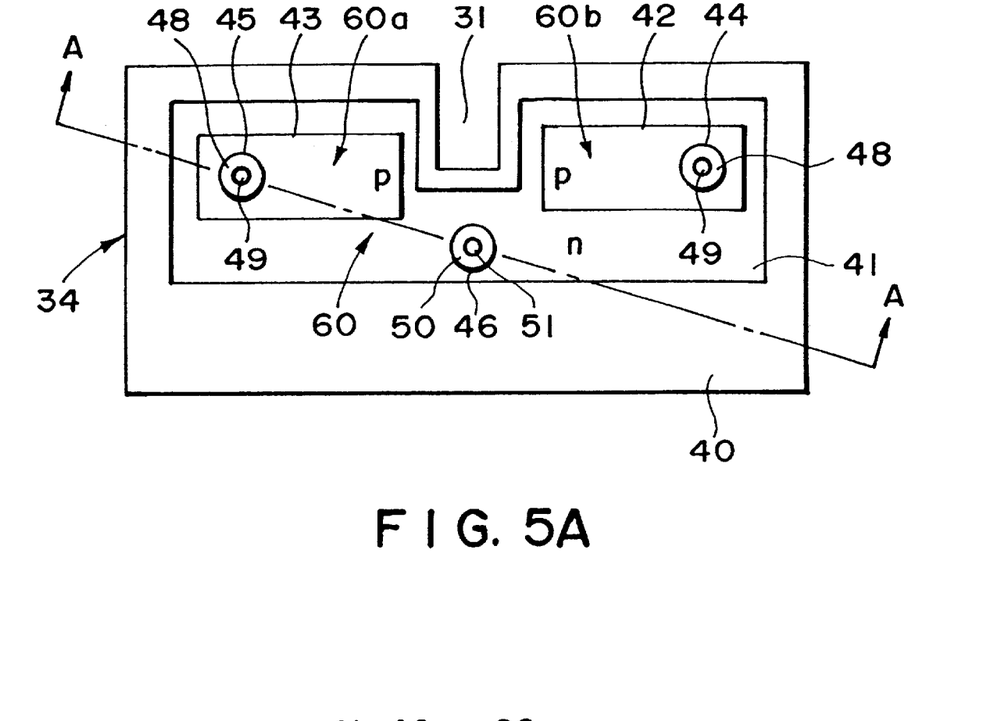
FIG. 5A is a front view when viewed from the light-receiving portion side.
Figure 5B:
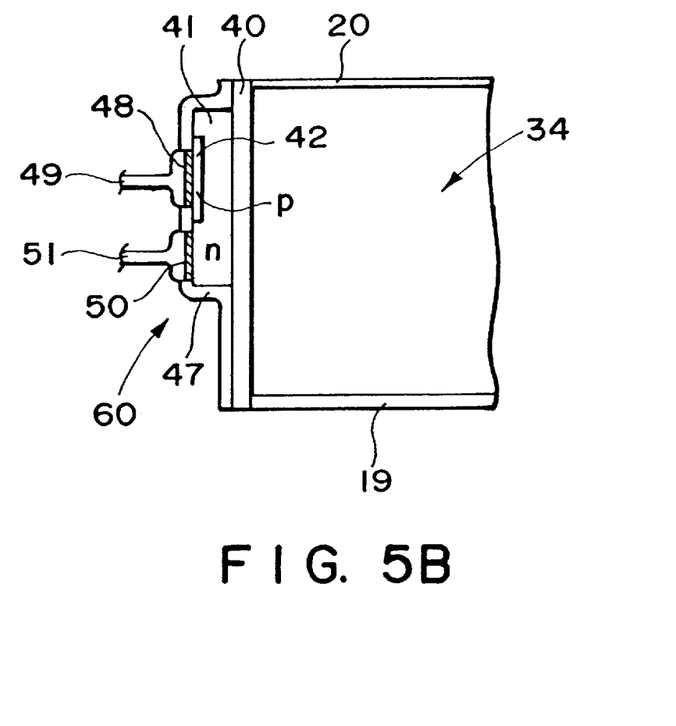
FIG. 5B is a sectional view.

The second embodiment of the present invention will be described below with reference to FIGS. 5A, 5B, 6 and 7. FIGS. 5A and 5B show the arrangement of a multi-beam laser chip 34. FIG. 5A shows the multi-beam laser chip 34 from the side of back beams. FIG. 5B is a sectional view taken in a direction perpendicular to a direction A—A in FIG. 5A. In the first embodiment, the photodetector 37 is prepared independently of the multi-beam laser chip 34, and is adhered thereto. However, in this embodiment, a photodetector 60 is integrally formed on the light-emitting surface end portion of the multi-beam laser chip 34.

The integrated formation processes will be explained below. An insulating layer 40 is formed on the light-emitting surface end portion of the multi-beam laser chip 34. This insulating layer 40 is formed of a transparent material to insulate the conductive portion of the multi-beam laser chip 34 from the photodetector 60, and to guide laser beams to the photodetector 60. For example, an $SiO_2$ film or the like is used for this material.

An n-type semiconductor layer 41 is locally formed on the transparent insulating layer 40. As the formation method, a method of growing a crystal by epitaxial growth and a method of forming an amorphous n-type semiconductor are normally used.

Figure 6:
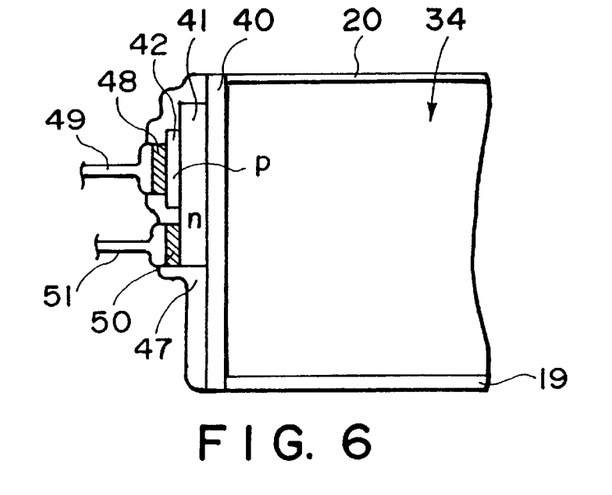
FIG. 6 is a sectional view showing a modification of a film formation method shown in FIGS. 5A and 5B.

P-type semiconductor layers 42 and 43 are formed in an island pattern on the n-type semiconductor 41. These layers can be formed by doping a p-type donor or depositing a p-type amorphous semiconductor. FIG. 6 shows an example when an amorphous semiconductor is formed by deposition. Since the p-type semiconductor layer 42 is deposited on the n-type semiconductor layer 41, the deposited portion forms a bulged portion.

Referring back to FIGS. 5A and 5B, an $SiO_2$ film 47 is formed as a protection film on the structure shown in FIG. 5A except for electrode lead portions 44, 45, and 46. The electrode lead portions 44 and 45 serve as anode electrodes of the photodetector 60. A metal 48 such as Au or the like is deposited on the surfaces of the p-type semiconductor layers 42 and 43, and wires 49 such as Au, Al, or the like are bonded to these deposited surfaces. On the other hand, the electrode lead portion 46 serves as a cathode electrode, and a metal 50 such as Au or the like is similarly deposited thereon. After that, a wire 51 such as Au, Al, or the like is bonded thereto. With this structure, the p-type semiconductor regions 42 and 43 formed with the anode electrodes 44 and 45 correspond to light-receiving portions 60a and 60b of the photodetector 60.

In this fashion, since the anode electrodes 44 and 45 of the photodetector 60 must be independently formed on the light-receiving portions 60a and 60b but the cathode electrode 46 can be commonly formed, the number of lead lines can be reduced by one. In this embodiment, two beams are detected. However, as the number of beams increases, the saving effect of the number of lines becomes larger accordingly.

Figure 7:
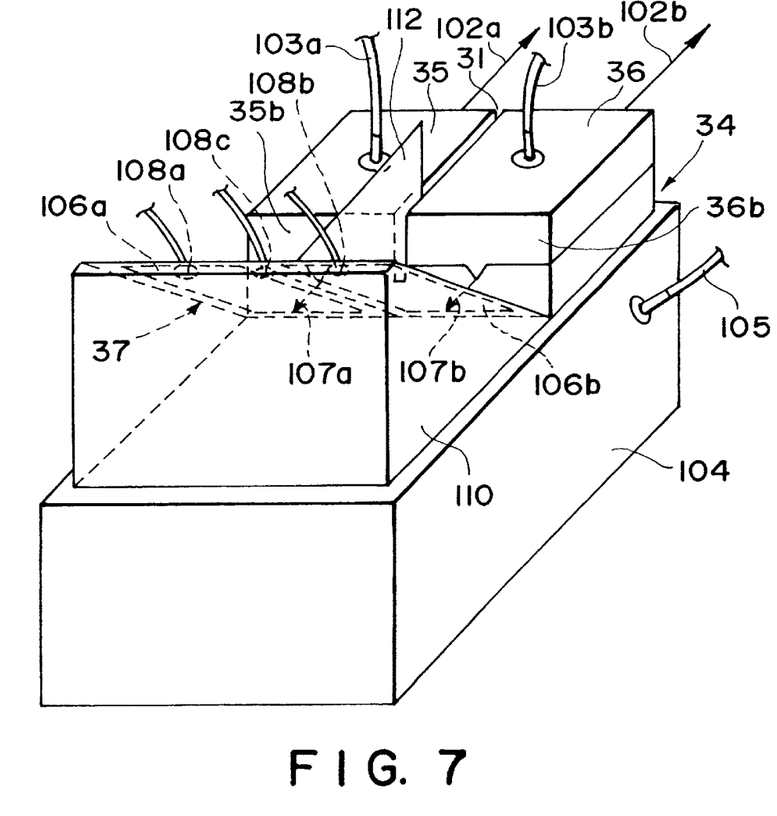
FIG. 7 is a perspective view showing the arrangement of a semiconductor laser device according to the third embodiment of the present invention.

The third embodiment of the present invention will be described below with reference to FIGS. 7 and 8. As shown in FIG. 7, light-emitting portions 35 and 36 of a multi-beam laser chip 34 output back beams, and have the same structure as that of the light-emitting portions 35 and 36 of the first embodiment shown in FIG. 1. LD electrodes 103a and 103b are respectively bonded to the cathodes of the light-emitting portions 35 and 36. The light-emitting portion 35 and 36 are set on a mount 104. The mount 104 serves as a heat sink of the light-emitting portions 35 and 36 of the multi-beam laser chip 34, and as an anode common to the two light-emitting portions. A common electrode 105 is bonded to the mount serving as a common anode of the light-emitting portions.

Light-receiving portions 106a and 106b of a photodetector 37 respectively receive back beams 107a and 107b respectively emitted by the light-emitting portions 35 and 36 of the multi-beam laser chip 34. Front beams 102a and 102b are output in correspondence with the back beams 107a and 107b. The internal structure of the photodetector 37 is the same as that shown in FIG. 2 above. Metal electrodes such as Au are formed as PD electrodes 108a to 108c, and wires such as Au, Al, or the like are bonded to these electrodes. The PD electrodes 108a and 108b serve as the anodes of the light-receiving portions 106a and 106b of the photodetector 37, and the PD electrode 108c serves as a cathode common to the two light-receiving portions.

Figure 8:
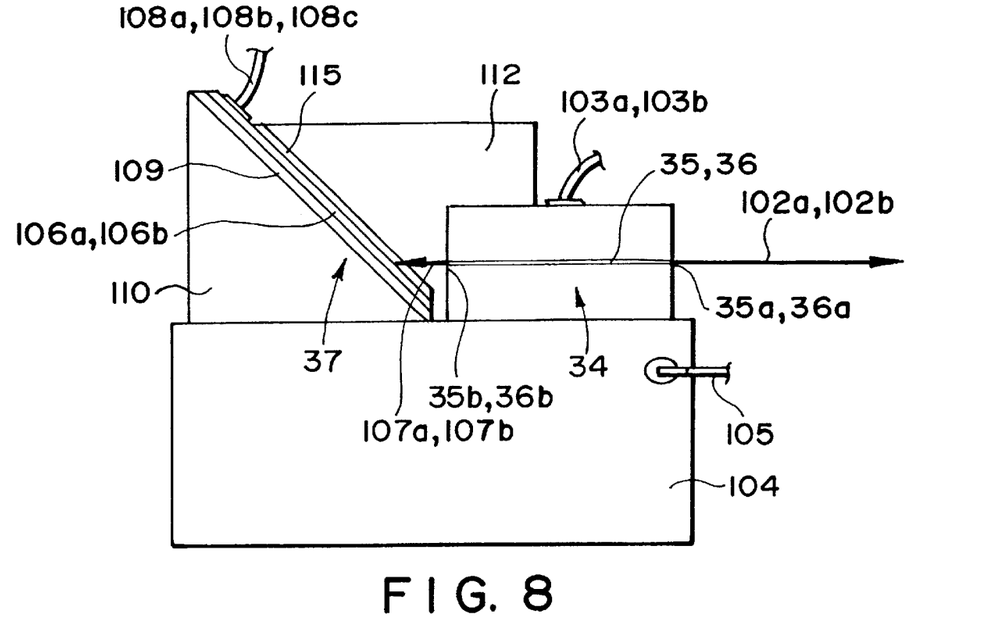
FIG. 8 is a side view of the semiconductor laser device shown in FIG. 7.

As shown in FIG. 8, the photodetector 37 with the plurality of light-receiving portions 106a and 106b is adhered to an inclined base 110 to sandwich an insulating layer 109 therebetween. That is, the light-receiving portions 106a and 106b of the photodetector 37 are set obliquely with respect to light-emitting surfaces 35b and 36b for outputting back beams of the light-emitting portions 35 and 36. With this setup, the back beams 107a and 107b reflected by the photodetector 37 can be prevented from being mixed with the front beams 102a and 102b, thus preventing ghost and poor light amount control precision.

Note that the inclined base 110 is formed of a heat-insulating material not to conduct heat produced by the light-emitting portions 35 and 36 since it is set on the mount 104. In the photodetector 37, the light-receiving portions 106a and 106b may be formed to be small as in the first embodiment, but may be formed to be larger than that.

A double-surface mirror 112 is set between the plurality of light-receiving portions 106a and 106b. This double-surface mirror 112 is insulated, and is held by an isolation trench 31 of the multi-beam laser chip 34, and the photodetector 37. With this double-surface mirror 112, the back beams 107a and 107b can be isolated from each other without being superposed on each other on the light-receiving portions 106a and 106b. Hence, the back beams 107a and 107b output from the light-emitting surfaces 35b and 36b of the light-emitting portions 35 and 36 can be independently detected. Furthermore, since the back beams 107a and 107b that have become incident on the double-surface mirror 112 are reflected by its mirror surface, and enter the light-receiving portions 106a and 106b of the photodetector 37, the back beams 107a and 107b are input to the light-receiving portions 106a and 106b opposing the light-emitting surfaces 35b and 36b of the light-emitting portions 35 and 36, thus preventing light energy (light amount) from attenuating. In this way, the outputs from the light-emitting portions 35 and 36 can be independently detected with high precision.

In this embodiment as well, using the light amount control circuits shown in FIGS. 3A and 3B above, high-precision light amount control can be done in real time in units of light-emitting portions 35 and 36 of the semiconductor laser device. When the light amount control of the semiconductor laser device of this embodiment is done in real time, the multi-beam laser chip 34 can be prevented from being influenced by thermal interference, and a high-quality image can be obtained.

An optical filter 115 is inserted to attenuate the light amounts of the back beams 107a and 107b. If a plurality of light-receiving portions are formed on a single substrate of a photodetection means, and a strong back beam enters one light-receiving portion, the produced photoelectrons leak to other light-receiving portions, i.e., blooming takes place. However, since the optical filter 115 is inserted, such blooming can be prevented. A light-shielding surface may replace the double-surface mirror 112 to obtain the same effect.

Figure 9:
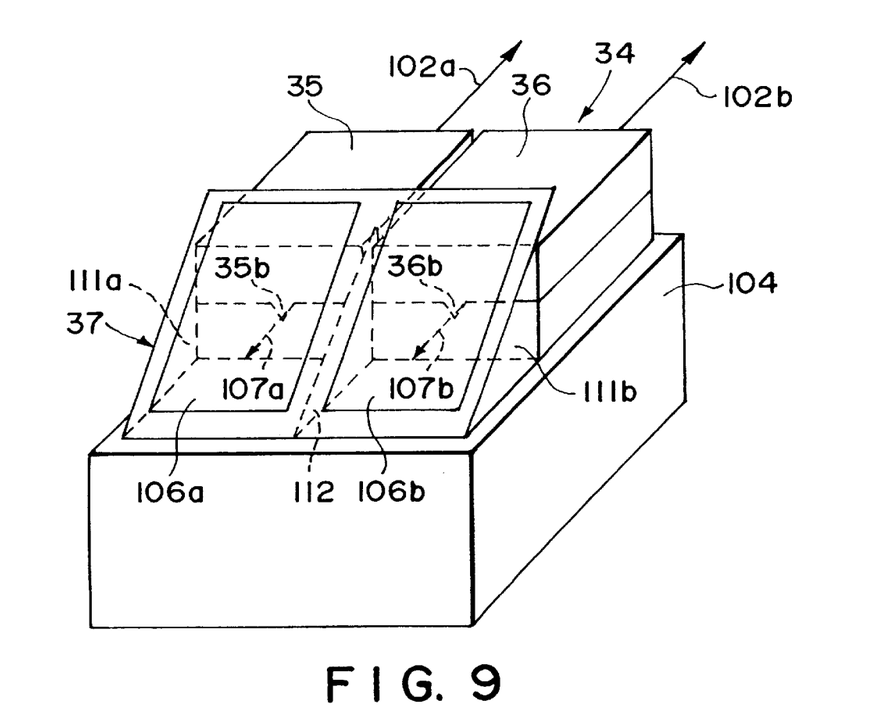
FIG. 9 is a perspective view showing the arrangement of a semiconductor laser device according to the fourth embodiment of the present invention.
Figure 10:
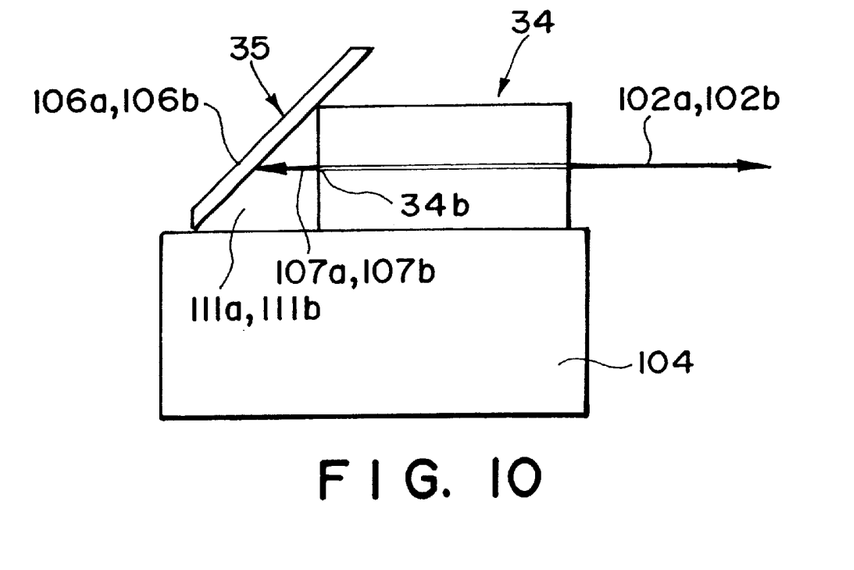
FIG. 10 is a side view of the semiconductor laser device shown in FIG. 9.

The fourth embodiment of the present invention will be described below with reference to FIGS. 9 and 10. This embodiment is a modification of the third embodiment, and the light-receiving method of the light-receiving portions 106a and 106b is changed. Note that a description of the same portions as those in the third embodiment will be omitted.

Light-emitting portions 35 and 36 of a multi-beam laser chip 34 output back beams 107a and 107b, and are mounted on a mount 104. Light-receiving portions 106a and 106b receive the back beams 107a and 107b emitted by light-emitting surfaces 35b and 36b of the light-emitting portions 35 and 36 of the photodetector 37 of the multi-beam laser chip 34.

A photodetector 37 with such plurality of light-receiving portions 106a and 106b is set on the inclined surfaces of light transmission members 111a and 111b. The inclined surfaces of the light transmission members 111a and 111b have a shape so that the light-receiving portions 106a and 106b have a tilt with respect to the back beams 107a and 107b emitted by the light-emitting surfaces 35b and 36b of the light-emitting portions 35 and 36. Since the light-receiving portions are obliquely set, the back beams 107a and 107b reflected by the photodetector 37 are prevented from being mixed with front beams 102a and 102b, thus preventing ghost and poor light amount control precision. The light transmission members 111a and 111b are formed of a heat insulating material not to conduct heat produced by the light-emitting portions 35 and 36 since they are set on the mount 104. Note that the size of the light-receiving portions 106a and 106b of the photodetector 37 of this embodiment is the same as that in the third embodiment.

In the third embodiment, the double-surface mirror 112 between the light-receiving portions 106a and 106b is held by the isolation trench 31 of the multi-beam laser chip 34, and the photodetector 37. In this embodiment, since the boundary surface of the light transmission members 111a and 111b is formed as the double-surface mirror 112, the double-surface mirror 112 and photodetector 37 can be easily held with respect to the semiconductor laser. Furthermore, since the double-surface mirror 112 is arranged, the back beams 107a and 107b can be isolated from each other without being superposed on each other on the light-receiving portions 106a and 106b. Hence, the back beams 107a and 107b output from the light-emitting surfaces 35b and 36b of the light-emitting portions 35 and 36 can be independently detected, thus independently and accurately detecting the outputs from the light-emitting portions 35 and 36.

In this embodiment as well, the light-emitting portions 35 and 36 of the semiconductor laser device can be subjected to high-precision light amount control in real time as in the third embodiment. Also, a light-shielding surface may replace the double-surface mirror 112 to obtain a blooming prevention effect.

Figure 11:
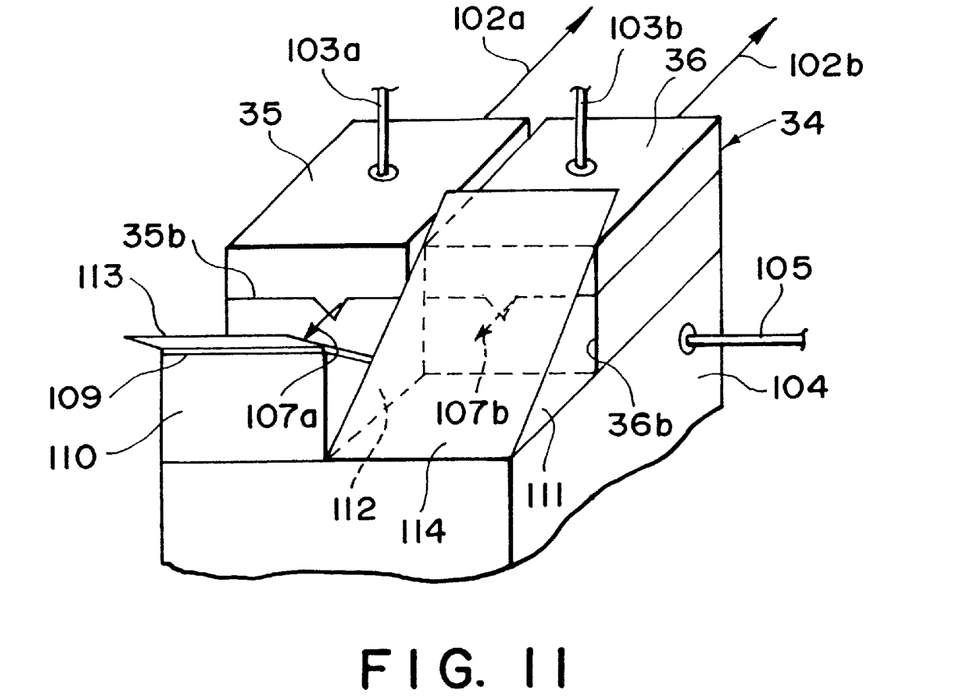
FIG. 11 is a perspective view showing the arrangement of a semiconductor laser device according to the fifth embodiment of the present invention.
Figure 12:
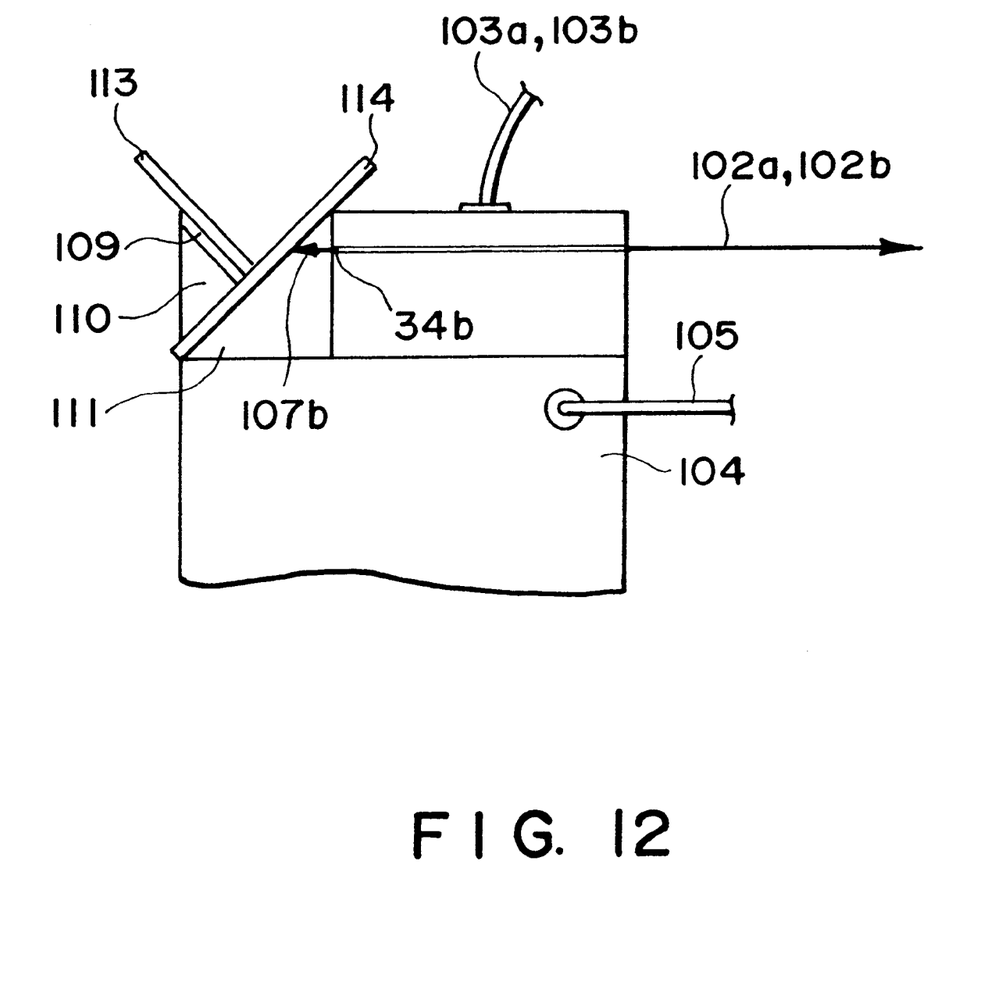
FIG. 12 is a side view of the semiconductor laser device shown in FIG. 11.

The fifth embodiment of the present invention will be described below with reference to FIGS. 11 and 12. This embodiment is a modification of the third and fourth embodiments, and a description of the same portions as those in these embodiments will be omitted.

Light-emitting portions 35 and 36 of a multi-beam laser chip 34 are mounted on a mount 104. LD electrodes 103a and 103b are bonded to the cathodes of the light-emitting portions 35 and 36. A common electrode 105 is bonded to the mount 104 serving as an anode common to the light-emitting portions.

Photodetectors 113 and 114 respectively receive back beams 107a and 107b produced by the multi-beam laser chip 34. The internal structure of these photodetectors 113 and 114 is the same as that shown in FIG. 2.

The photodetector 113 that receives the back beam 107a emitted by the light-emitting portion 35 of the multi-beam laser chip 34 is adhered to an inclined base 110 via an insulating layer 109. That is, the light-receiving surface of the photodetector 113 is set obliquely with respect to a light-emitting surface 35b that emits the back beam 107a of the light-emitting portion 35. The photodetector 114 that receives the back beam 107b emitted by the light-emitting portion 36 of the multi-beam laser chip 34 is set on a light transmission member 111. This light transmission member 111 obliquely sets the light-receiving surface of the photodetector 114 with respect to a light-emitting surface 36b that emits the back beam 107b of the light-emitting portion 36. With this arrangement, the back beams 107a and 107b reflected by the photodetectors 113 and 114 are prevented from being mixed with front beams 102a and 102b, thus preventing ghost and poor light amount control precision.

Note that the inclined base 110 and light transmission member 111 are made of a heat insulating material so as not to conduct heat produced by the light-emitting portions 35 and 36 since they are mounted on a mount 104. Also, the size of the photodetectors 113 and 114 in this embodiment is the same as that in the third embodiment.

In the third embodiment (see FIG. 7), the double-surface mirror 112 between the light-receiving portions 106a and 106b is held by the isolation trench 31 of the multi-beam laser chip 34, and the photodetector 37. In this embodiment, that surface of the light transmission member 111, which is on the side of the inclined base 110 is formed as the double-surface mirrors 112. In this way, since the surface of the light transmission member 111 on the side of the inclined base 110 is formed as the double-surface mirrors 112, the double-surface mirror 112 and photodetector 113 can be easily held with respect to the semiconductor laser. Also, since the light transmission member 111 need only be arranged in correspondence with every other photodetectors, the cost of the light transmission member 111 can be reduced.

Furthermore, since the double-surface mirror 112 is arranged, the back beams 107a and 107b can be isolated from each other without being superposed on each other on the light-receiving portions 106a and 106b. Hence, the back beams 107a and 107b output from the light-emitting surfaces 35b and 36b of the light-emitting portions 35 and 36 can be independently detected, thus independently and accurately detecting the outputs from the light-emitting portions 35 and 36.

In this embodiment as well, the light-emitting portions 35 and 36 of the semiconductor laser device can be subjected to high-precision light amount control in real time. Also, a light-shielding surface may replace the double-surface mirror 112 to obtain a blooming prevention effect.

Figure 13:
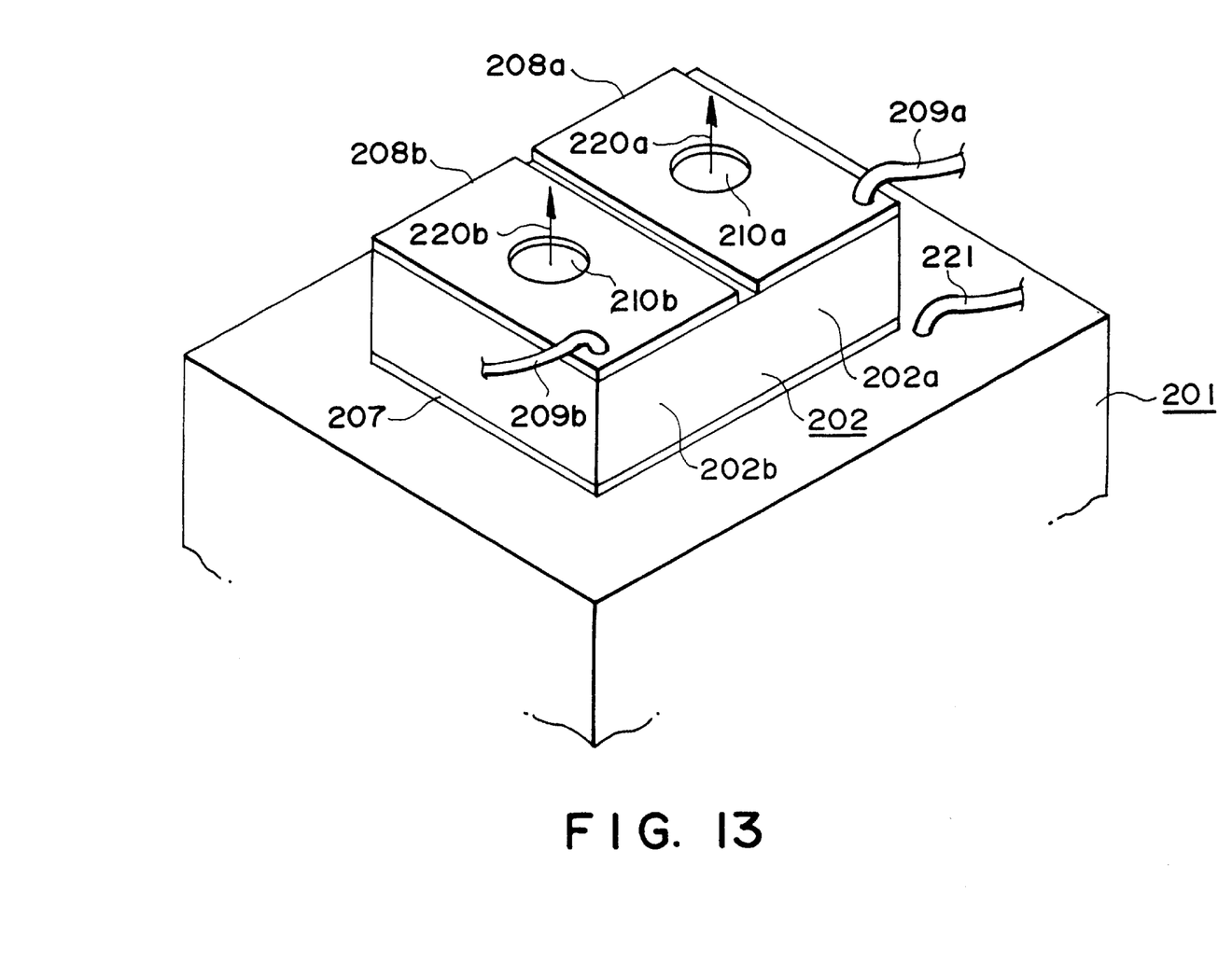
FIG. 13 is a perspective view showing the arrangement of a semiconductor laser device according to the sixth embodiment of the present invention.
Figure 14:
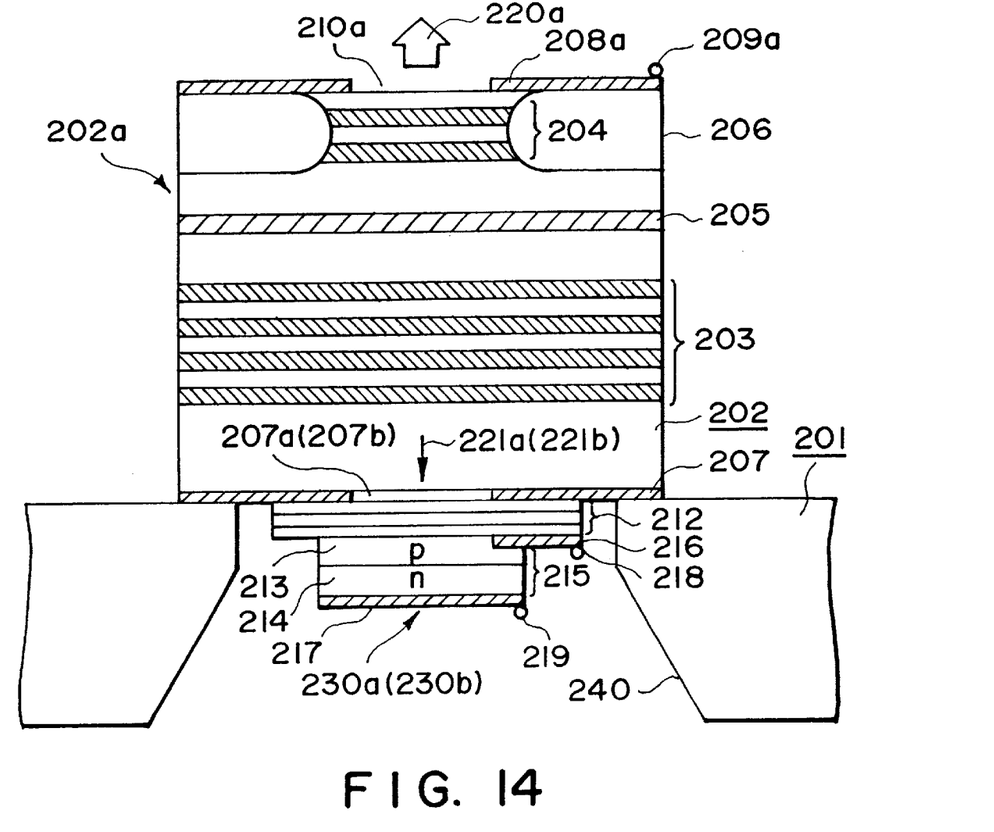
FIG. 14 is a partially cutaway sectional view of the semiconductor laser device shown in FIG. 13.

The sixth embodiment of the present invention will be described below with reference to FIGS. 13 to 15.

This embodiment will exemplify a surface-emitting laser diode. Since the surface-emitting laser diode is generally called a Vertical Cavity Surface Emitting Laser, it will be abbreviated as a VCSEL. FIG. 13 is a perspective view of the VCSEL. FIG. 14 is a sectional view of the VCSEL.

The VCSEL structure shown in FIG. 13 will be described below. A VCSEL chip 202 is mounted on a copper mount 201. This VCSEL chip 202 is fabricated using a gallium-arsenide (GaAs) semiconductor wafer as a base.

The VCSEL chip 202 is comprised of two light-emitting portions 202a and 202b. Electrodes 208a and 208b are respectively formed on the upper portions of the light-emitting portions 202a and 202b. Holes 210a and 210b for outputting front beams 220a and 220b are formed on these electrodes 208a and 208b. Furthermore, power supply bonding wires 209a and 209b are respectively connected onto the surfaces of the electrodes 208a and 208b.

Beneath the light-emitting portions 202a and 202b, an electrode 207 is commonly connected thereto. Furthermore, holes 207a and 207b for outputting back beams 221a and 221b are formed on the electrode 207 in correspondence with the holes 210a and 210b. Electric power is supplied to this electrode 207 via a bonding wire 221.

The VCSEL structure shown in FIG. 14 will be described below. FIG. 14 shows the sectional structure of one light-emitting portion 202a in FIG. 13. Multilayered mirrors 203 and 204 are formed by alternately stacking GaAs and AlAs layers. An AlGaAs or GaAs active layer 205 serves as a quantum well (to be referred to as a QW hereinafter), and emission takes place in this active layer. A block layer 206 confines a current. The electrodes 207 and 208a are formed on the lower and upper surfaces of this structure.

In a mount 201 under the VCSEL chip 202, light-receiving portions 230a and 230b are formed in correspondence with the light-emitting portions 202a and 202b. Note that FIG. 14 illustrates the light-receiving portion 230a alone.

An insulating layer 212 consists of silicon oxide ($SiO_2$). This insulating layer 212 is transparent, and transmits an incident beam therethrough. A photodiode 215 is formed by p- and n-type silicon layers 213 and 214. Note that p- and n-type GaAs layers may replace the p- and n-type silicon layers 213 and 214.

Electrodes 216 and 217 are formed on the photodiode 215. The electrode 216 may be formed into a ring shape. Gold or aluminum bonding wires 218 and 219 are bonded to the electrodes 216 and 217 to detect a signal. In order to easily insert a bonding head upon bonding the bonding wires 218 and 219, i.e., to assure easy work, tapers 240 are formed on the mount 201 around the photodiode 215.

The operation of the VCSEL shown in FIGS. 13 and 14 will be explained below.

When a current is supplied between the upper electrodes 208a and 208b and lower electrode 207 of the VCSEL, the QW active layer 205 is excited to emit light. The emission output is repetitively reflected between the multilayered mirrors 203 and 204, and only light of a specific wavelength resonates. Note that an optical resonator constructed by these multilayered mirrors 203 and 204 is called a virtual cavity.

The resonating light components are output from the holes 210a and 210b of the electrodes 208a and 208b as the front beams 220a and 220b in the direction of the arrow. Also, some light components are output as the back beams 221a and 221b in the direction opposite to that of the front beams 220a and 220b. In this case, the back beams 221a and 221b are output from the holes 207a and 207b of the electrode 207. The output back beams 221a and 221b are independently detected by the photodiodes 215 of the light-receiving portions 230a and 230b. The independently detected back beam signals are sent to the light amount control device shown in FIG. 3 to make light amount control, thus independently adjusting the amounts of the front beams 220a and 220b.

A modification of the sixth embodiment of the present invention described above will be explained below with reference to FIG. 15.

Figure 15:
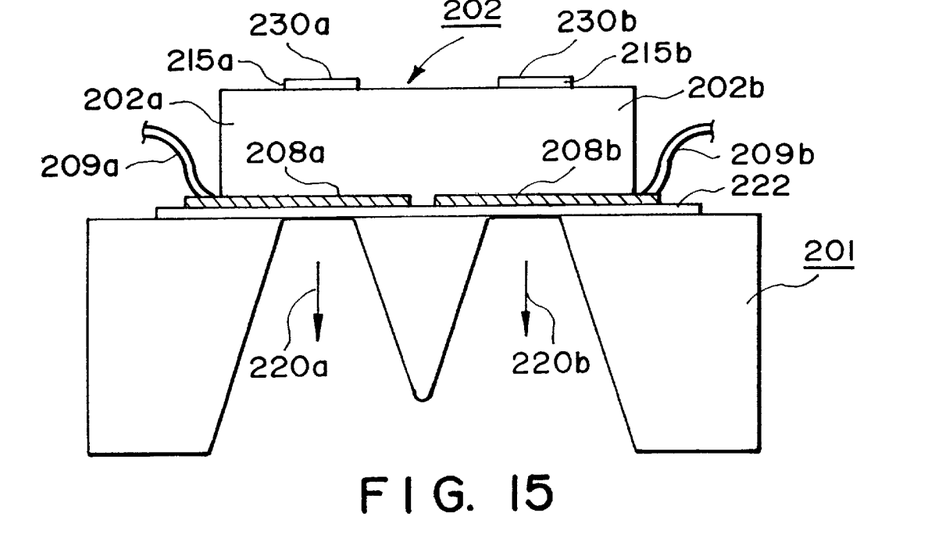
FIG. 15 is a side view showing a modification of FIG. 13.

In FIG. 15, the exit direction of the front beams 220a and 220b is directed toward the mount 201. In this case, holes (not shown) are formed on the mount 201 so as not to intercept the outgoing front beams 220a and 220b. Also, an insulating layer 222 is formed on the mount 201 to prevent the bonding wires 209a and 209b connected to the electrodes 208a and 208b from short-circuiting. Note that other arrangements are the same as those in FIGS. 14 and 15, and a detailed description thereof will be omitted.

To restate, according to the present invention, since a semiconductor laser having a plurality of light-emitting portions comprises back beam detection means for independently detecting a plurality of back beam outputs, real-time light amount control can be made in units of light-emitting units. With this arrangement, variations in amount of laser outputs caused by thermal interference between the light-emitting portions can be reduced. Also, since the back beam detection means is in tight contact with the one-end face side of the light-emitting portions of the semiconductor laser chip, light reflected by the surface of the back beam detection means neither leaks toward the front side nor is superposed on front beams that leave from the front side, thus preventing a phenomenon of increased beam size.

Also, according to the present invention, since the back beam detection means is in tight contact with the one-end face side of the light-emitting portions of the semiconductor laser chip, and is constructed by a single substrate having a plurality of photodetection portions isolated from each other, light beams can be received with a small beam size, and back beam detection means with a small light-receiving area can be used. Hence, a large isolation distance can be assured between the plurality of photodetection portions formed on the single substrate. Also, since back beam detection means with a small light-receiving area can be used, the stray capacitance can be reduced, and photodetection that allows high-speed response can be realized. Furthermore, since back beam detection means having a plurality of photodetection portions formed on a single substrate is used, light-receiving elements can be efficiently laid out, thus allowing easy manufacture.

According to the present invention, since a transparent insulating layer is formed on a surface including the light-emitting portions on the one-end face side of the semiconductor laser chip, and the back beam detection means is formed on the insulating layer, a large insolation distance between the light-receiving portions can be assured, and light can be guided to the back beam detection means with minimum attenuation.

According to the present invention, since the back beam detection means is formed by epitaxial growth or deposition, the back beam detection means can be accurately aligned, and can be prepared by minimum required materials.

According to the present invention, since the back beam detection means is attached so that its end portion extends from the end face of the semiconductor laser chip, and lead electrodes are formed on that extending portion, the electrodes can be formed in a minimum required space.

According to the present invention, since a light-shielding surface is inserted between laser beams that enter the back beams detection means, the light beams can be isolated from each other so as not to be superposed on the light-receiving surface of the back beam detection means.

According to the present invention, since a mirror is inserted between laser beams that enter the back beams detection means, light can be prevented from attenuating on the light-receiving surface of the back beam detection means.

According to the present invention, since light transmission members are formed on a surface including the light-emitting portions on the one-end face side of the semiconductor laser chip, the back beam detection means is placed on each member to have a tilt with respect to the light-emitting surface of an incoming laser beam, and a light-shielding surface for intercepting light beams that enter the back beam detection means is formed on the surface between the adjacent light transmission members, the semiconductor laser and back beam detection means can be easily held.

According to the present invention, light transmission members are formed on a surface including the light-emitting portions on the one-end face side of, e.g., every other semiconductor laser chips, and the back beam detection means is placed on each member to have a tilt with respect to the light-emitting surface of an incoming laser beam. Also, for other semiconductor laser chips, the back beam detection means is set to have a tilt with respect to the light-emitting surface of an incoming laser beam, and a light-shielding surface for each laser beam that enters the back beam detection means is formed on the side surface of each light transmission member. Hence, as the light transmission members need only be arranged in every other laser chips, the cost of the light transmission members can be reduced. Furthermore, photodetection means can be divided, and interference of photocurrents between neighboring photodetection means can be prevented.

According to the present invention, since an optical filter is interposed between the light-emitting portions of the semiconductor laser chip and back beam detection means, excessively fat beams can be prevented from entering the light-receiving portions, and interference due to current leakage between the neighboring light-receiving portions can be prevented.

What is claimed is:

1. A semiconductor laser device comprising:

a semiconductor laser chip having a first light-emitting surface which is formed on one end face of said semiconductor laser chip and outputs a plurality of front beams, and a second light-emitting surface which is formed on another end face of said semiconductor laser chip opposite to said first light-emitting surface and outputs a plurality of back beams corresponding to the plurality of front beams from a plurality of back beam emitting portions; and back beam detection means having a light-receiving surface which includes a plurality of photodetection portions for independently detecting the plurality of back beams output from said second light-emitting surface, wherein said light-receiving surface is disposed in parallel with the arrangement direction of said plurality of back beam emitting portions and is inclined with reference to said second light-emitting surface.

2. A device according to claim 1, wherein said back beam detection means is set on an inclined surface of a light transmission member.

3. A device according to claim 1, wherein light-shielding means is inserted between light beams that enter said photodetection portions of said back beam detection means.

4. A device according to claim 1, wherein a mirror is inserted between light beams that enter said photodetection portions of said back beam detection means.

5. A device according to claim 1, wherein an optical filter is interposed between said second light-emitting surface and said back beam detection means.

6. A device according to any of claims 1–4, further comprising light amount feedback control means for independently controlling amounts of the front beams output from said first light-emitting surface on the basis of amounts of light detected by said photodetection portions of said back beam detection means.

7. An image forming apparatus comprising:

a recording medium;

a semiconductor laser device according to claim 6;

an optical system for focusing the plurality of front beams output from said semiconductor laser device on said recording medium; and a light deflector for deflecting the plurality of front beams output from said semiconductor laser device.

8. A semiconductor laser device according to claim 1, wherein said second light-emitting surface outputs two back beams.

* * * * *

UNITED STATES PATENT AND TRADEMARK OFFICE
CERTIFICATE OF CORRECTION

PATENT NO. : 6,587,495 B2
DATED : July 1, 2003
INVENTOR(S) : Junichi Kimizuka et al.

It is certified that error appears in the above-identified patent and that said Letters Patent is hereby corrected as shown below:

Column 5,
Line 10, "an" should be deleted.

Column 6,
Line 25, "voltage," should read -- voltages, --; and
Line 37, "in" should read -- in the --.

Column 7,
Line 35, "portion" should read -- portions --.

Column 10,
Line 17, "photodetectors" should read -- photodetector, --.

Column 11,
Line 61, "in" should read -- in the --.

Column 12,
Line 24, "insolation" should read -- isolation --;
Line 39, "beams detection" should read -- beam detection --;
Line 43, "back beams" should read -- back beam --; and
Line 62, "chips," should read -- chip, --.

Column 13,
Line 5, "chips," should read -- chip, --.

Signed and Sealed this

Eleventh Day of November, 2003

JAMES E. ROGAN
*Director of the United States Patent and Trademark Office*